(12) United States Patent
Krausse, III et al.

(10) Patent No.: US 9,613,918 B1
(45) Date of Patent: Apr. 4, 2017

(54) RF POWER MULTI-CHIP MODULE PACKAGE

(71) Applicant: MICROSEMI CORPORATION, Bend, OR (US)

(72) Inventors: George J. Krausse, III, Bend, OR (US); Wang-Chang Albert Gu, Bend, OR (US)

(73) Assignee: MICROSEMI CORPORATION, Bend, OR (US)

( * ) Notice: Subject to any disclaimer, the term of this patent is extended or adjusted under 35 U.S.C. 154(b) by 620 days.

(21) Appl. No.: 14/153,948

(22) Filed: Jan. 13, 2014

Related U.S. Application Data

(60) Provisional application No. 61/752,025, filed on Jan. 14, 2013.

(51) Int. Cl.
*H01H 47/00* (2006.01)
*H01L 23/66* (2006.01)
*H01L 23/00* (2006.01)

(52) U.S. Cl.
CPC .............. *H01L 23/66* (2013.01); *H01L 24/97* (2013.01)

(58) Field of Classification Search
CPC ................................ H01L 23/66; H01L 24/97
USPC .......................................... 307/126, 130, 113
See application file for complete search history.

(56) References Cited

U.S. PATENT DOCUMENTS

| | | | |
|---|---|---|---|
| 8,410,591 B2* | 4/2013 | Otremba | H01L 23/4952 257/676 |
| 8,957,514 B1* | 2/2015 | Barnette | H02M 3/00 257/691 |
| 9,209,176 B2* | 12/2015 | Wu | H01L 27/0883 |
| 9,443,431 B1* | 9/2016 | Laird | G06Q 30/0265 |
| 2003/0155897 A1* | 8/2003 | Miftakhutdinov | H02J 1/102 323/282 |
| 2004/0003305 A1* | 1/2004 | Tokunaga | G06F 1/263 713/300 |
| 2006/0138538 A1* | 6/2006 | Ohmi | H01L 21/28211 257/341 |
| 2011/0055795 A1* | 3/2011 | Okano | G06F 17/5036 716/136 |
| 2011/0101940 A1* | 5/2011 | Kudo | H02M 3/1584 323/282 |
| 2012/0068681 A1* | 3/2012 | Ejury | H01L 23/642 323/311 |
| 2012/0086416 A1* | 4/2012 | Kudo | H02M 3/1584 323/265 |

(Continued)

*Primary Examiner* — Viet Q Nguyen
(74) *Attorney, Agent, or Firm* — Marger Johnson

(57) ABSTRACT

High power multi-chip module packages for packaging semiconductor dice are disclosed. The disclosed packages have an output power of at least 1 kilowatt (kW) and can have an operating signal frequency in a range of hundreds of MHz. The high power multi-chip module packages have base plates with multiple planes or layers that can be conductive and may be thin metal layers in some examples. The multiple planes are formed and overlaid in such a way that they help reduce stray inductance values caused by the packaging itself, which improves overall device operation and efficiency. Current loops created when one of the multi-chip modules is in a turn-on condition are balanced and opposed and generate a minimized B-Field that is restricted by the manner in which the multiples planes of the base plate are overlaid, thus reducing the stray inductance values and improving device operation.

18 Claims, 7 Drawing Sheets

(56) References Cited

U.S. PATENT DOCUMENTS

2016/0277008 A1* 9/2016 Green ............... H02M 3/158
2016/0308523 A1* 10/2016 Otake ............... H01L 29/7813

* cited by examiner

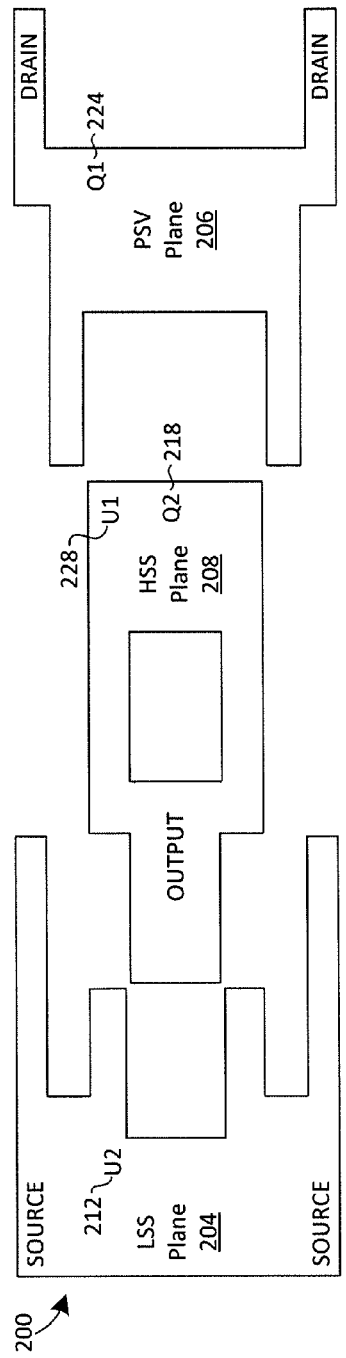
FIG. 6
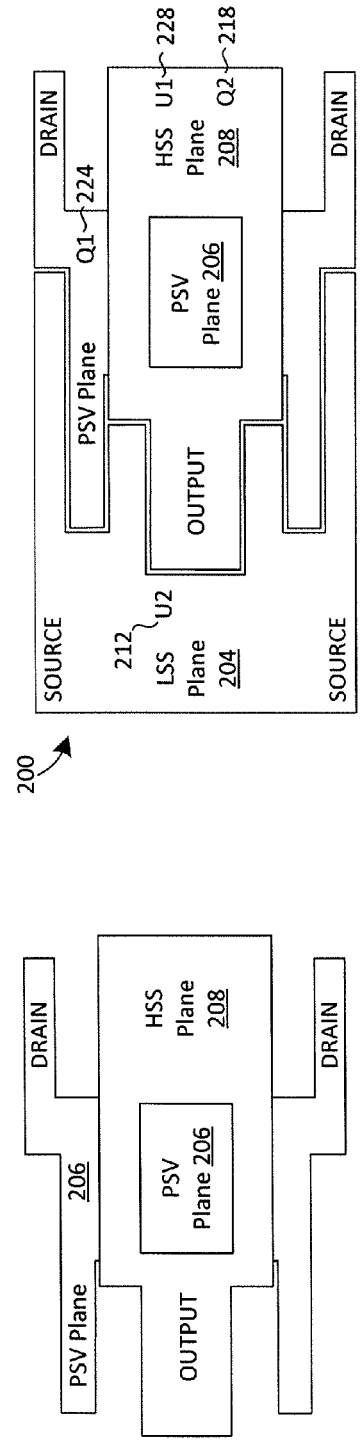
FIG. 7A
FIG. 7B

RF POWER MULTI-CHIP MODULE PACKAGE

CROSS-REFERENCE TO RELATED APPLICATION

This application claims the benefit of U.S. Provisional Patent Application Ser. No. 61/752,025, filed Jan. 14, 2013, which is herein incorporated by reference.

TECHNICAL FIELD

This disclosure is related to RF power devices and more specifically to RF power device packages.

BACKGROUND OF THE INVENTION

Semiconductor dice are packaged to enable the semiconductor to make electrical, thermal, and mechanical contact with the circuitry and/or circuit board in which it is mounted. However, the packaging itself adds or modifies the electrical, thermal, and mechanical properties of the die so that in the resulting packaged product the circuitry on the die performs differently than in the case of the die alone.

Product designers try to minimize the 'parasitic' effects of unwanted capacitance or inductance induced by the package. These parasitic effects tend to cause a reduction in performance of the product from the design specifications.

Special care must be taken in package design when devices, such as MOSFETS, are operated at high power levels and RF frequencies. Heat generated during the operation of the device must be dissipated, and unwanted capacitances and inductances must be minimized to attain maximum operating frequency, power gain, and proper matching from stage to stage. Current RF power device packages are limited in both power output and signal operating frequency capabilities in an effort to control unwanted capacitance and inductance.

For example, some RF power packages are limited to an operating frequency of approximately 30 megahertz (MHz) for high (>1 kilowatt) output power applications. In particular, conventional high power RF packages are generally limited to use with signal frequencies much lower than 1 MHz for an output power limit of a few hundred watts or are limited for use with signal frequencies less than 10 MHz for an output power limit of a few watts to approaching 1000 W. Other known high power RF power packages are generally limited for use with signal frequencies less than 30 MHz for an output power of a few hundred watts and approaching 1 kilowatt (kW). In addition, few of the known devices have an integrated driver. Most of the known classes of devices employ a direct-copper-bonded (DCB) alumina substrate. The DCB alumina substrates are cost effective but provide poor thermal performance, which makes their use in very high power applications a poor choice.

Unfortunately, developments in circuitry require increasingly higher signal frequencies at high output power levels. There is a need in the art for a high power RF package arranged for use with operating signal frequencies of hundreds of MHz.

SUMMARY OF THE INVENTION

It is, therefore, an object of the invention to create a high power RF package that has an output power of at least 1 kW and can support an operating frequency signal in a range of up to hundreds of MHz. Such performance capabilities are achieved by minimizing magnetic field open area and forming balanced and opposed current loops to achieve magnetic field cancellation, which reduces stray inductance values of the package.

In an example, a base plate for a high power multi-chip module package having a power output of at least 1 kilowatt (kW) and an operating signal frequency in a range of hundreds of MHz is disclosed. The base plate includes a low side switch (LSS) plane having an LSS protrusion; a positive supply voltage (PSV) plane having a first recession and a second recession; and a high side switch (HSS) plane, in which a portion of the HSS plane placed over a portion of the PSV plane. The first recession of the PSV plane is configured to receive the LSS protrusion and cause the LSS plane and the PSV plane to be intermingled. The HSS plane has an HSS protrusion structured to intermingle with the second recession of the PSV plane. The HSS plane is placed over the portion of the PSV plane to define an HSS-PSV plane edge. An open gap is defined between an intermingled edge of the LSS plane and the HSS-PSV plane edge. Multiple transistor dies are mounted to the base plate. At a turn-on condition for the multiple transistor dies, transistor die driver current loops are created by currents flowing from the multiple transistor dies to respective multiple transistor die drivers that are balanced and opposed. Output current loops are also created by currents flowing from the multiple transistor dies to an output destination that are also balanced and opposed.

High power multi-chip module packages that include the above described base plates are also disclosed herein, along with methods of assembling such packages.

The foregoing and other objects, features and advantages of the invention will become more readily apparent from the following detailed description, which proceeds with reference to the accompanying drawings.

BRIEF DESCRIPTION OF THE DRAWINGS

FIG. 6 is an example assembly drawing of multiple planes of the disclosed base plate.

FIG. 7A is an assembly drawing of the overlaid HSS and PSV planes of the base plate shown in FIG. 6.

FIG. 7B is an assembly drawing of the overlaid HSS and PSV planes of FIG. 7A and the interleaved LSS plane of the disclosed base plate.

DETAILED DESCRIPTION

The present embodiments facilitate the manipulation of magnetic fields due to in-phase currents as opposed to differential signals which have been the focus of prior art solutions.

In an embodiment, a high power RF package is disclosed that allows for an operating frequency in a range of hundreds of MHz and provides a power output of at least 1 kW. The disclosed high power RF packaged devices use conductive surfaces to minimize magnetic field open area and form balanced and opposed current loops to achieve magnetic field cancellation, which reduces stray inductance values.

Some embodiments of the disclosed high power RF packaged devices minimize the magnetic field open areas and achieve magnetic field cancellation by employing a thick film process to assemble individual conductive layers of the device itself.

The disclosed embodiments describe a device with an RF half-bridge module, but the principles can be applied to other RF topologies such as a push-pull amplifier stage, a full bridge module, or other circuit topologies with component layout symmetry.

To operate half bridge topology power devices at RF frequencies from 30 MHz-hundreds of MHz while producing kilowatts of RF power output, the present disclosure manipulates magnetic fields caused by in-phase currents, as opposed to differential signals which have been the focus of conventional solutions.

Figure 1:
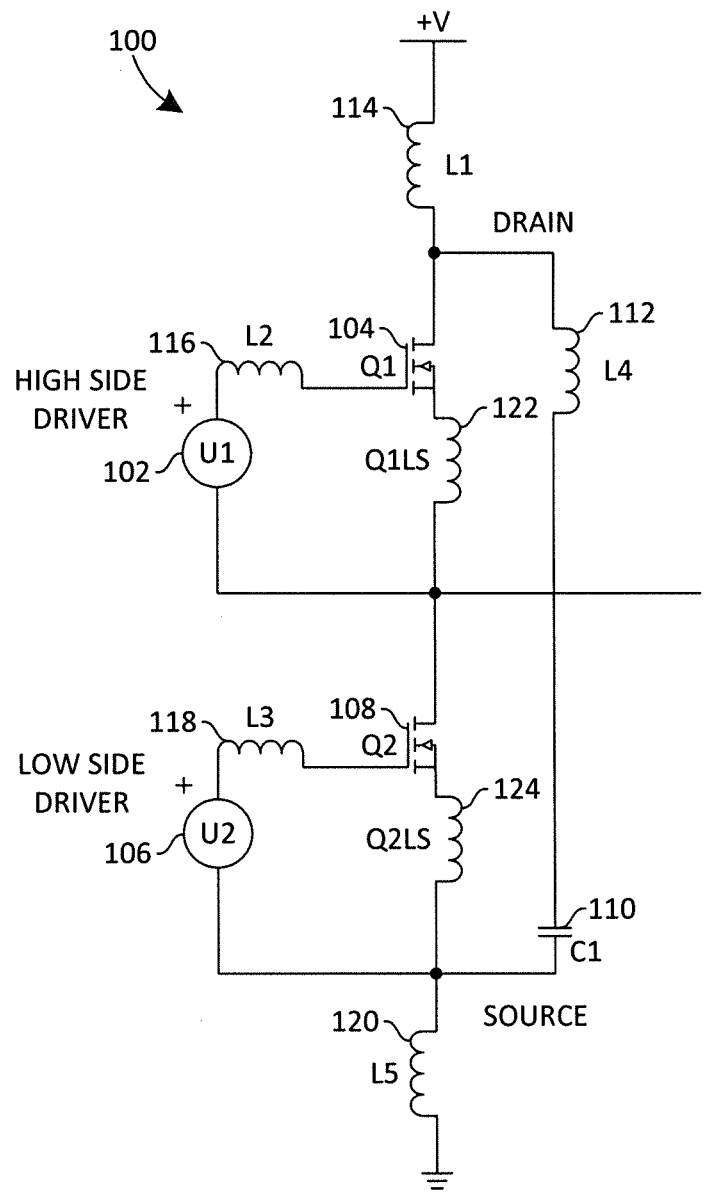
FIG. 1 is an example half bridge circuit schematic showing two transistors, their respective drivers, and various stray inductance values, according to aspects of the disclosure.

An example half bridge schematic 100 is illustrated in FIG. 1. Driver U1 102 is the driver for the high side switch Q1 104. Driver U2 106 is the driver for the low side switch Q2 108. The capacitor C1 110 (Shunt C) is a passive component connected in between the drain of switch Q1 104 and the source of switch Q2 108 to maintain a constant voltage between these two circuit nodes. The value of capacitor C1 110 is application dependent and inductor L4 112 represents unwanted circuit stray inductance and which is preferably minimized for high frequency operation. Thus, capacitor C1 110 and inductor L4 112 are shown connected in series between the drain of switch Q1 104 and the source of switch Q2 108. Inductors L1 114, L2 116, L3 118, L5 120, Q1LS 122 and Q2LS 124 similarly represent circuit stray virtual components that are preferably minimized for high frequency operation of the disclosed high power RF devices with a half bridge module, as shown in FIG. 1.

In addition, high side driver U1 102 and low side driver U2 106 each have low inductive terms to facilitate high frequency operation of the device. In the disclosed embodiments, driver U1 102 has a switching speed and frequency performance required of the application in which the device is to be used, which causes inductor L2 116 to degrade the drive to switch Q1 104 and thus the overall system performance. Similarly, inductor L3 118 degrades the drive to switch Q2 108 and further degrades the overall system performance.

In a real circuit implementation, the stray inductance values represented by inductors L1 114, L4 112, and L5 120 and caused by the packaging of the high power RF device are dependent on the physical layout of the circuit and placement of the circuit components. The target values for these stray inductances may be estimated, such as by setting the target values to a desired maximum percentage of the inductance of the output circuit to which the half bridge module is applied. Therefore, the required physical layout may be modeled based on the inductance value of the output circuit to which the half bridge is applied.

For example, the output of the circuit schematic of FIG. 1 can be applied to a resonant network that matches a 50Ω load to the MOSFET's 3Ω drain impedance and is designed to operate at a frequency of 60 MHz. The resonant network series inductor is 31 nH and the resonant network shunt capacitor is 210 pF. All stray inductances of the half bridge module 100, inductors L1 114, L2 116, L3 118, L4 112, and L5 120, can have a maximum value that is a very small percentage of 31 nH for optimal operation of the device at a frequency of 60 MHz. The maximum target value for each stray inductance can be 1.5% of the resonant network series inductor, which would require the values of inductors L1 114, L2 116, L3 118, L4 112, and L5 120 to be about 0.5 nH each.

Figure 2A:
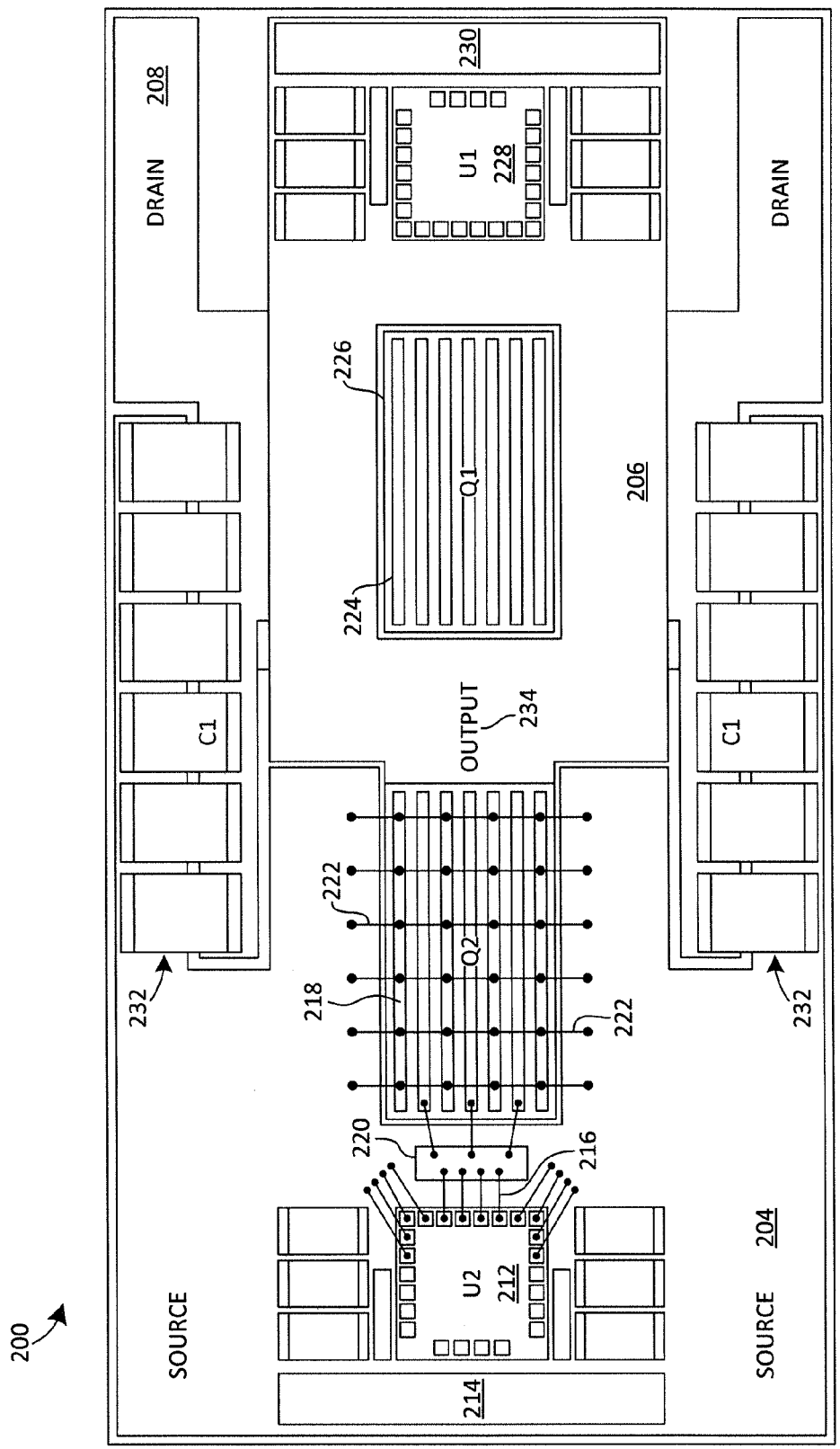
FIG. 2A is a top view of an RF half-bridge module layout for the example half bridge circuit schematic shown in FIG. 1.
Figure 2B:
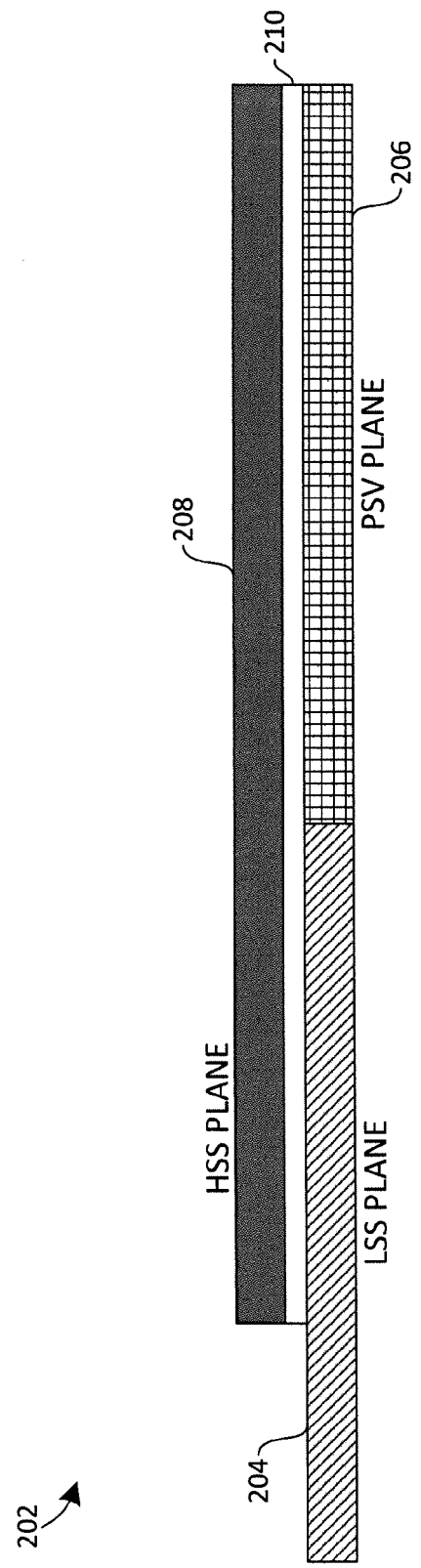
FIG. 2B is a side view of the RF half-bridge module layout shown in FIG. 2A.

The layout and magnetic field cancellation methodology of the present embodiments are capable of meeting the inductance target values for inductors L1 114, L2 116, L3 118, L4 112, and L5 120. FIG. 2A is a top view of an RF half-bridge module layout 200 according to some embodiments, and FIG. 2B is a side view thereof. All components are shown mounted to the module base plate 202. The base plate 202 is constructed of three sub-plates or planes: 1) a source terminal plate, also known as the Low Side Switch (LSS) plane 204; 2) a drain terminal plate, also known as the Positive Supply Voltage (PSV) plane 206; and 3) an output terminal plate, also known as the High Side Switch (HSS) plane 208.

The source terminal plate 204 and drain terminal plate 206 are coplanar, in this example, and have various protrusions of the drain terminal plate 206 meeting respective recessions of the source terminal plate 204 so as to be intermingled, resulting in a reduced magnetic field (B-Field), as will be described below. An intermingled edge of the source terminal plate 204 is the edge of the source terminal plate 204 that intermingles with the protrusions of the drain terminal plate 206.

The protrusions of the drain terminal plate 206 and the recessions of the source terminal plate 204 are complementary, in this example, and nest within each other to create a dovetail-type, intermingled configuration. The output terminal plate 208 is placed over the drain terminal plate 206 and is insulated therefrom by a glass overlay 210 placed on one side of the drain terminal plate 206, and in some areas intermingles with respective recessions of the source terminal plate 204, further cooperating to reduce the B-Field, as will be described further below.

The positive output of low side driver U2 212 is mounted on the LSS plane 204, along with its associated driver control circuitry 214 and is connected by wire bonding 216 to the gate of low side MOSFET switch Q2 218, through an intermediary junction 220. Low side MOSFET switch Q2 218 is mounted on the output terminal plate 208, and the drain of low side MOSFET switch Q2 218 is electrically soldered thereto. The source of low side MOSFEET switch Q2 218 is illustrated as facing up and the drain thereof is facing down. The source of low side MOSFET switch Q2 218 is connected by wire bonding 222 to the source terminal plate 204. Similarly, the source of high side MOSFEET switch Q1 224 is illustrated as facing up and the drain thereof is facing down. High side MOSFET switch Q1 224 is mounted on the drain terminal plate 206, and thus the drain of high side MOSFET switch Q1 224 is connected to the drain terminal, i.e. to the positive supply voltage.

The source of high side MOSFET switch Q1 224 is connected by wire bonds (not shown) to the output terminal plate 208, with high side MOSFET switch Q1 224 appearing through a cut-out 226 in the output terminal plate 208. High side driver U1 228 is mounted on the output terminal plate 208, along with its associated electronics 230. Shunt capacitor 232, C1, shown as 12 sub-units, is arranged to connect between the drain terminal plate 206 and the source terminal plate 204. The positive voltage is connected to the drain terminal of the drain terminal plate 206. The return potential is connected to the source terminal of the source terminal plate 204, and the output lead is connected to the output terminal 234 of the output terminal plate 208.

The field conditions for high side driver U1 228 and high side MOSFET switch Q1 224 are the mirror image of the respective low side circuitry, and thus are equally applicable to the high side MOSFET switch Q2. In the interest of brevity, only the inductive terms for the low side driver U2 212 and low MOSFET switch Q2 218 are described below in detail. Those skilled in the art will understand that the principles being described for the low side MOSFET switch Q2 218 are equally applicable to the high side MOSFET switch Q1 224.

Current Loops and Magnetic Fields

Figure 3:
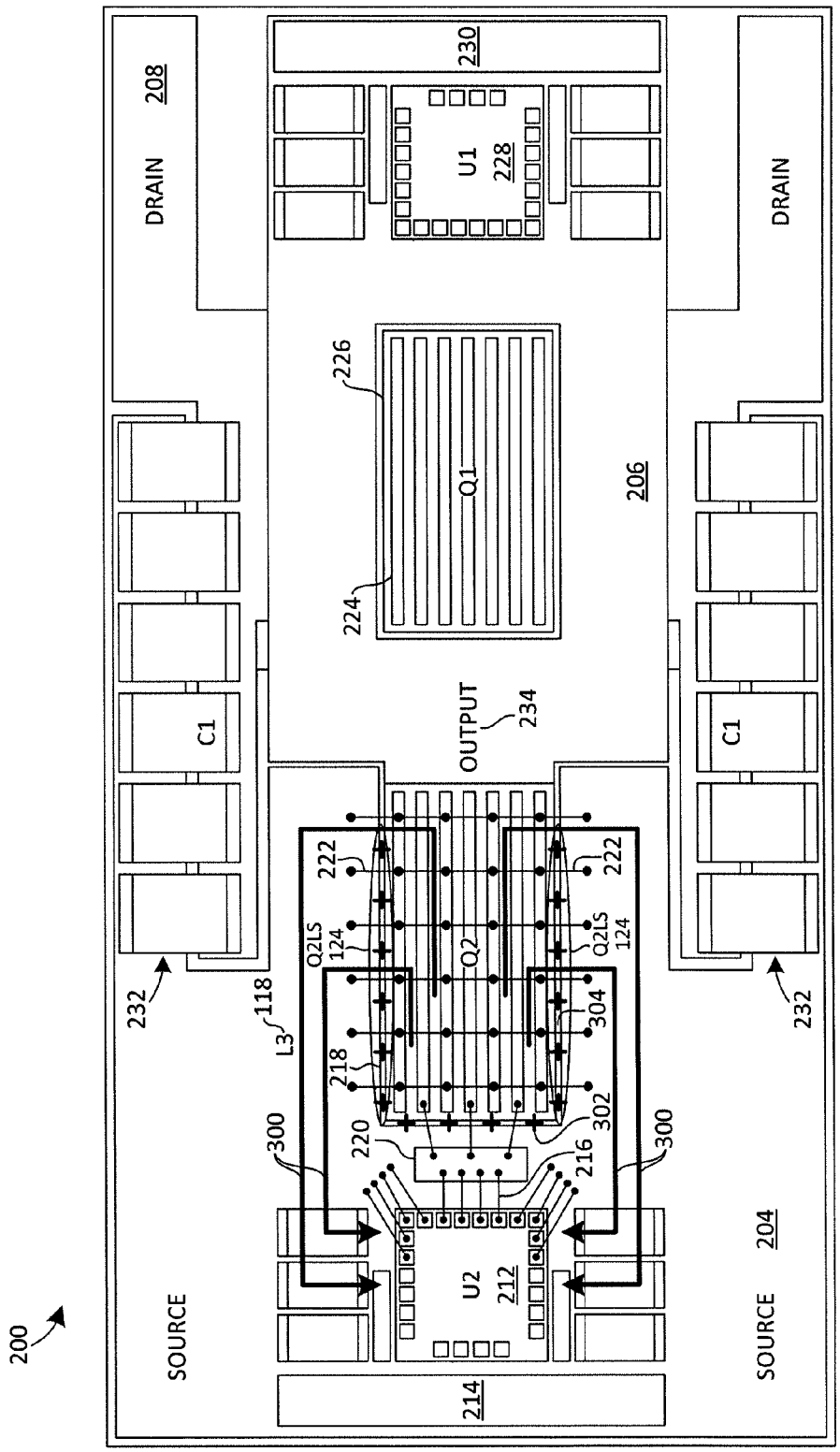
FIG. 3 is the top view of the RF half-bridge module layout shown in FIG. 2A with the addition of driver current loops and their generated B-Field that are created when one of the transistors is in a turn-on condition.
Figure 4:
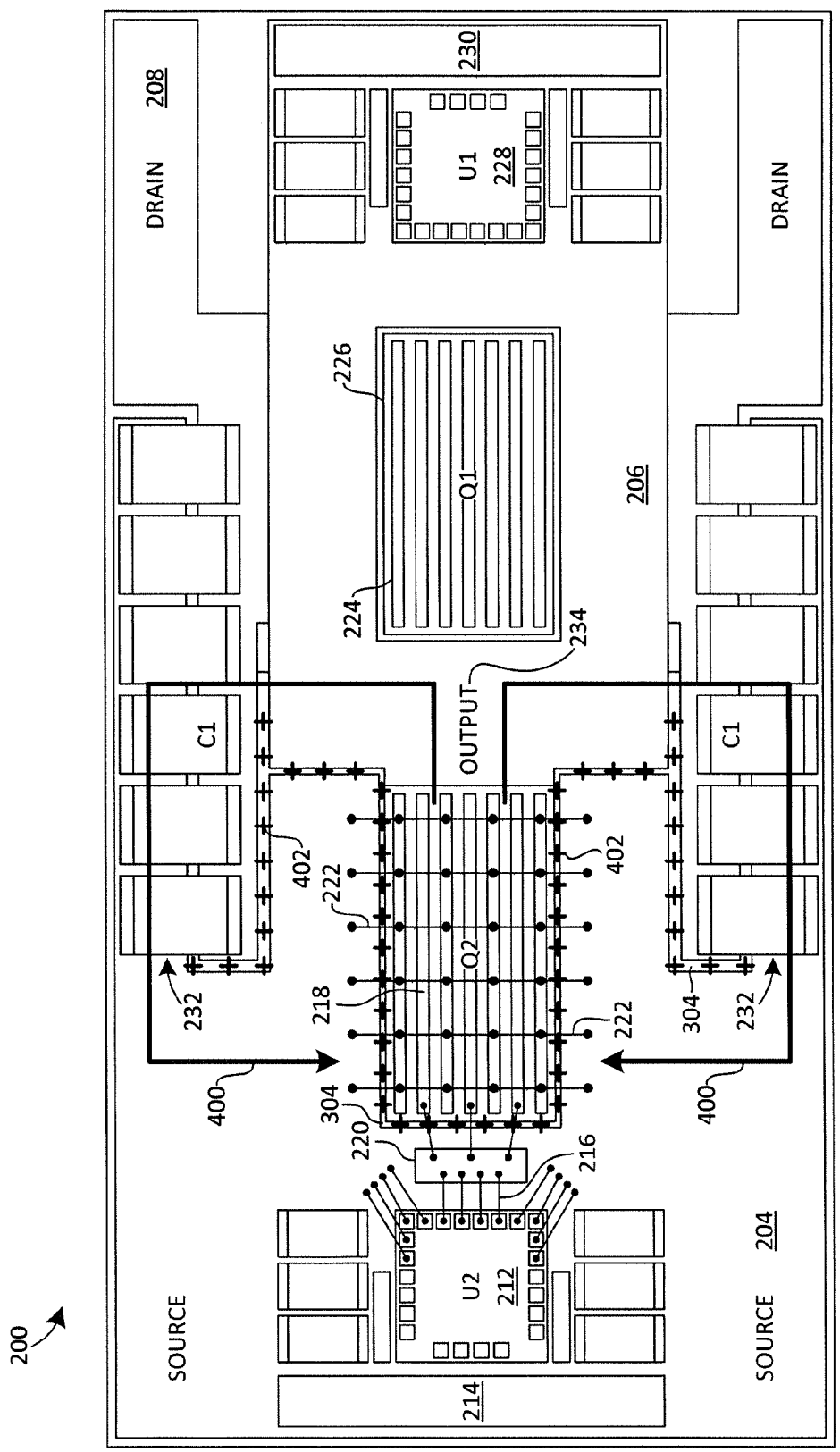
FIG. 4 is the top view of the RF half-bridge module layout shown in FIG. 2A with the addition of output driver current loops and their generated B-Field that are created when one of the transistors is in a turn-on condition.
Figure 5:
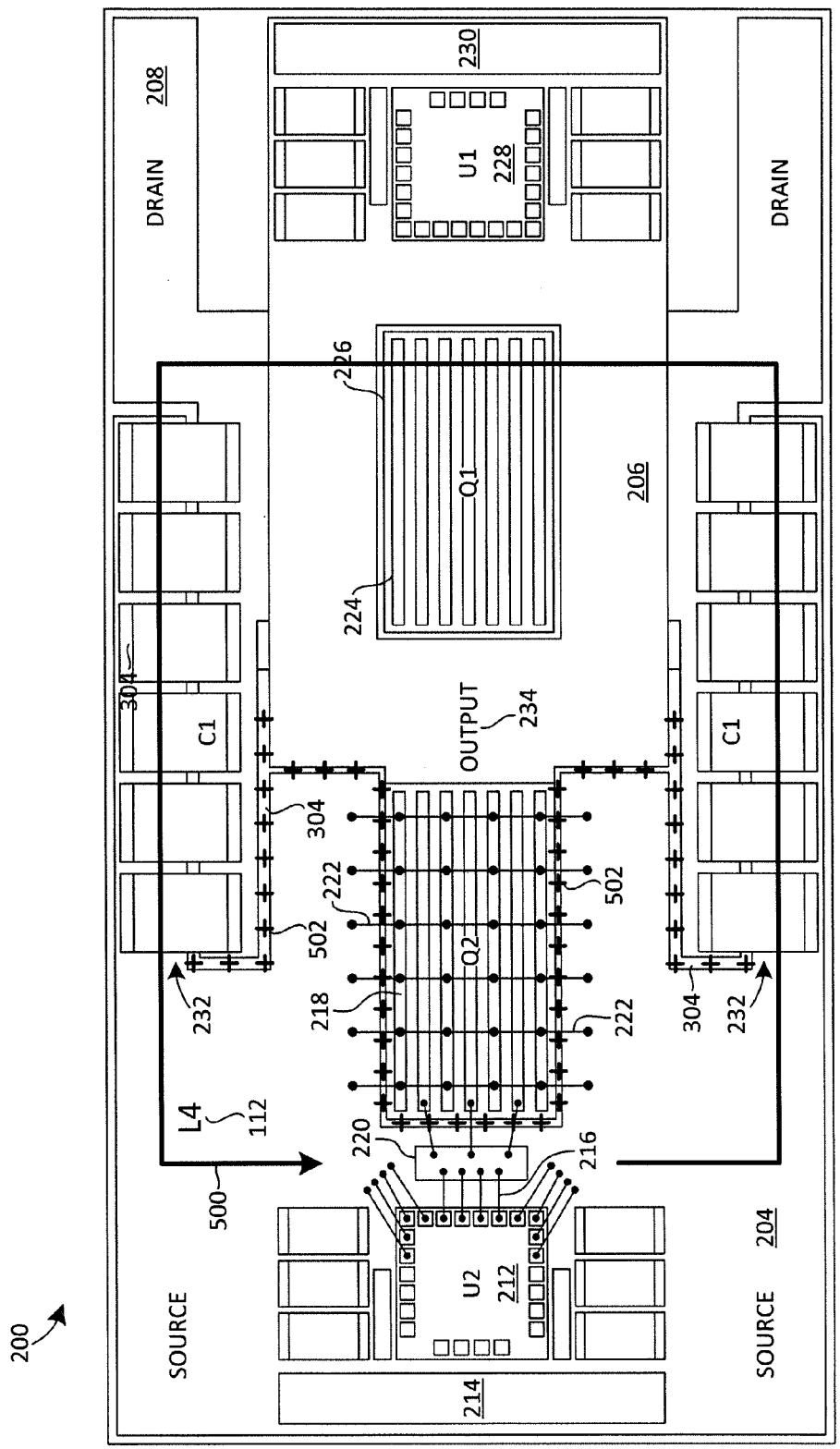
FIG. 5 is the same top view of the RF half-bridge module layout shown in FIG. 2A with the addition of a shunt capacitor and its associated stray inductance current loop and its generated B-Field that is created in a turn-on condition for one of the transistors.

FIGS. 3-5 show various current loops and their generated B-Fields, for the example half bridge circuit layout 200 shown in FIG. 2. There are three current loops shown in FIGS. 3-5—the gate driver loops shown in FIG. 3, the output switch current loops shown in FIG. 4, and the L4 C1 current loop shown in FIG. 5. Each current loop(s) is also shown with its corresponding B-Field. The current loops are represented by a heavy line having an arrowhead indicating its direction. The B-Fields are represented by heavy plus symbols and extend along a plane orthogonal to the page.

Gate Driver Loops

FIG. 3 illustrates the low side switch Q2 driver currents 300 that flow from driver U2 212 for the turn-on condition of switch Q2 218 and the stray inductance values of L3 118 and Q2LS 124. The current loops 300, shown as heavy lines with an arrow head, are balanced and opposed. This layout provides multiple parallel current paths from, and to, the low side switch Q2 218 MOSFET gate from driver U2 212 and a reduction in net inductance for both inductors L3 118 and Q2LS 124. The driver current B-Field 302 is orthogonal to the plane of the drawing and restricted to an open gap 304 defined by the intermingled edge of the source terminal plate 204 where it does not meet the overlying output terminal plate 208. The open gap 304 is defined between the intermingled edge of the source terminal plate 204 and an edge of the overlaid output terminal plate 208 and drain terminal plate 206.

The driver current B-Field 302 is represented as black plus symbols indicating that the B-Field is orthogonal to the illustration plane, and pointing in the direction of the viewer. These two elements, a balanced, opposed topology, and a B-Field area restricted to the open gap 304 within the driver current loops 300, provide a reduction in stray inductance values associated with inductors L3 118 and Q2LS 124, and therefore increase operating frequency of the device.

First Order Inductance Calculation for Gate Driver Current Loops

Verification that the embodiment shown in FIG. 3 supports high frequency power packaging is as follows:

$$\text{Inductance is defined as: } L \approx N^2 \mu_0 \mu_r A / W \quad \text{EQ. 1}$$

Where:
N=number of turns, N=1→N2=1, with N=1 since as current flows from one point to another in a circuit it forms a loop from source out through the loop and returns to the source return;
$\mu_0$=1.256 e-6 H/M, (Permittivity of free space);
$\mu_r$=1.0, (Relative Permittivity of the Dielectric);
A=M2, (Area of B-Field); and
W=Thickness of the plane in which current is flowing Based on EQ. 1, inductance, L, is reduced by increasing the thickness of the plane in which the current is flowing, W, while decreasing the area of the B-Field, A. The B-Field area, A, of the embodiment of FIG. 3 is generally in the shape of a "U" around MOSFET Q2 218. The contribution of the B-Field area, A, to the total inductive term, represented by the combination of inductors L3 118 and Q2LS 124 for switch Q2 218, and similarly represented by the combination of inductors L2 and Q1LS for switch Q1 (not shown), are calculated in the following manner.

There are two horizontal areas marked with +++ to represent the B-Field and each enclosed in an oval, and a single vertical area similarly marked with +++. In this geometry, the B-Field area is a plane with virtually no thickness. The two horizontal areas are effectively in parallel; therefore the inductive value is divided by two for those segments. The vertical segment is a series element and is added to the results. For a B-Field area of 2.86 e-6 M2, with a width of 1, i.e. as small as possible while maintaining high voltage hold-off that is required between the plates, and utilizing EQ. 1, the following inductance value is achieved:

$$L \approx 1 \cdot 1.256 \text{ e-6 H/M} \cdot 1 \cdot 2.86\text{e-6 M2} = 0.32 \text{ He-9 for one horizontal area}$$

Given that the horizontal driver current B-Field areas are in parallel, the sum is 0.16 He-9. The vertical area is in series and adds to the total 0.16 He-9, and therefore the total inductance L3 is: 0.16 He-9+0.32 He-9=0.48 He-9, which, as indicated above, is the target value for maximum stray capacitance (for inductors L2 and L3), previously estimated for a 60 MHz MultiChip Module feeding a resonant network.

Output Switch Current Loops

FIG. 4 illustrates the low side switch Q2 output currents 400 (heavy arrowhead lines) for the turn-on condition of switch Q2 218. The output current loops 400 are balanced and in opposition. Given the current paths, the output current B-Field 402 is orthogonal to the plane of FIG. 4 and is illustrated as black plus symbols in the crosshatched field. The output current B-Field 402 is restricted to the open gap 304 between the output terminal plate 208 and the source terminal plate 204. The smaller the open gap 304, the smaller the package internal inductive terms are. The effect of a smaller internal inductive term is an increase in the switching speed and, therefore, the utility of the device.

L4 C1 Current Loop

As described above in relation to FIG. 1, capacitor C1 232 is connected between the drain of high side switch Q1 224 and the source of low side switch Q2 218 and maintains a constant voltage between these two circuit nodes. The value of capacitor C1 232 is application dependent. However, inductor L4 112 is an unwanted circuit stray effect and is preferably minimized. Capacitor C1 232 is an on-module capacitor.

FIG. 5 illustrates one half cycle of the L4 C1 current signal 500 and its generated L4 C1 B-Field 502. During the alternate cycle, the current direction 500 reverses and the direction of the L4 C1 B-Field 502 (black plus symbols) also reverses. In either half of the cycle, the L4 C1 current B-Field 502 is restricted to the open gap 304, depicted by the crosshatch pattern and created by the shapes and intermingling of the respective plates, since a time-dependent B-Field does not penetrate a conducting plane, which lowers the overall net inductance of inductor L4 112.

Base Plate Layout and Construction

Three major thick film metal planes 204, 206, 208 form the base plate 202 of the example half bridge schematic, as illustrated in FIG. 6, and as described above in relation to FIGS. 2A and 2B. The three planes 204, 206, 208 are positioned via multilayer thick film technology: the LSS plane A 204 with driver U2 secured thereon; the HSS plane B 208, with switch Q2 and driver U1 secured thereon; and the PSV plane C 206 with switch Q1 secured thereon. The three planes 204, 206, 208 are preferably thin metal layers that can be formed by any suitable means, such as printing and firing. LSS plane A 204 and PSV plane C 206 are co-planar (on one level), and HSS plane B 208 is on a second layer overlying planes A 204 and C 206, as described further in relation to FIGS. 7A and 7B, and as described above in relation to FIG. 2B.

The LSS plane A 204 provides an equipotential plane for low side driver U2 and the source connection of low side switch Q2, in addition to supporting other discrete components. The HSS B 208 provides an equipotential plane for high side driver U1 and for the source connection of high side switch Q1, in addition to supporting other discrete components.

FIG. 7A is an assembly drawing of planes B 208 and C 206 of FIG. 6. HSS plane B 208 is placed to partially overlay PSV plane C 206 in a balanced manner, with an intervening insulator, such as glass (not shown). FIG. 7B shows the assembly of planes B 208 and C 206 of FIG. 7A with LSS plane A 204, i.e. the combination of planes B 208 and C 206 are then interleaved with LSS plane A 204. As indicated above, PSV plane C 206 is preferably co-planar with LSS plane A. A final glass overlay acts as a solder mask (not shown).

Having described and illustrated the principles of the invention in a preferred embodiment thereof, it should be apparent that the invention can be modified in arrangement and detail without departing from such principles. We claim all modifications and variations coming within the spirit and scope of the following claims.

The invention claimed is:

1. A base plate for a high power multi-chip module package having a power output of at least 1 kilowatt (kW) and an operating signal frequency in the range of up to hundreds of MHz, comprising:
   a low side switch (LSS) plane having an LSS protrusion;
   a positive supply voltage (PSV) plane having a first recession and a second recession, the first recession configured to receive the LSS protrusion and cause the LSS plane and the PSV plane to be intermingled; and
   a high side switch (HSS) plane, a portion of the HSS plane placed over a portion of the PSV plane, the HSS plane having an HSS protrusion structured to intermingle with the second recession of the PSV plane, the HSS plane placed over the portion of the PSV plane to define an HSS-PSV plane edge; and
   an open gap defined between an intermingled edge of the LSS plane and the HSS-PSV plane edge;
   wherein at a turn-on condition for multiple transistor dies mounted to the base plate, transistor die driver current loops are created by currents flowing between the multiple transistor dies and respective multiple transistor die drivers that are balanced and opposed, and output current loops are created by currents flowing from the multiple transistor dies to an output destination that are also balanced and opposed.

2. The base plate of claim 1, wherein the LSS plane and the PSV plane are co-planar.

3. The base plate of claim 1, wherein the LSS plane, the PSV plane, and the HSS plane are all conductive.

4. The base plate of claim 1, wherein the LSS plane, the PSV plane, and the HSS plane are all thin metal layers.

5. The base plate of claim 1, wherein the transistor die driver currents generate a U-shaped transistor die driver current B-Field that is restricted to the open gap.

6. The base plate of claim 1, further comprising an insulator placed between the PSV plane and the HSS plane.

7. The base plate of claim 6, wherein the insulator includes a glass overlay.

8. The base plate of claim 1, wherein the HSS plane includes a cut-out and the cut-out is placed over the portion of the PSV plane.

9. The base plate of claim 1, wherein, at the turn-on condition, a shunt capacitor current loop is created by a current flowing from a shunt capacitor that maintains constant voltage between the multiple transistor dies to one of the multiple transistor dies, the shunt capacitor current loop surrounding the entire open gap, and the shunt capacitor current loop generating a shunt capacitor B-field restricted to the open gap.

10. A high power multi-chip module package having a power output of at least 1 kilowatt (kW) and an operating signal frequency in a range of up to hundreds of MHz, comprising:
    a base plate having:
       a low side switch (LSS) plane having an LSS protrusion;
       a positive supply voltage (PSV) plane having a first recession and a second recession, the first recession configured to receive the LSS protrusion and cause the LSS plane and the PSV plane to intermingle; and
       a high side switch (HSS) plane, a portion of the HSS plane placed over a portion of the PSV plane, the HSS plane having an HSS protrusion structured to intermingle with the second recession of the PSV plane, the HSS plane placed over the portion of the PSV plane to define an HSS-PSV plane edge; and
       an open gap defined between an intermingled edge of the LSS plane and the HSS-PSV plane edge;
    a high side switch and a high side driver electrically connected together, the high side switch mounted on the PSV plane and the high side driver mounted on the HSS plane;
    a low side switch and a low side driver electrically connected together, the low side switch mounted on the HSS plane and the low side driver mounted on the LSS plane; and
    a shunt capacitor arranged to electrically connect the PSV plane and the LSS plane and maintain a constant voltage between the high side switch and the low side switch;
    wherein, at a turn-on condition for either the high side switch or the low side switch, driver current loops are created by current flowing between the high side switch or the low side switch, whichever is in the turn-on condition, and the respective high side driver or low side driver, the driver current loops being balanced and opposed,
    and wherein, at the turn-on condition for either the high side switch or the low side switch, output current loops are created by currents flowing from the high side switch or the low side switch, whichever is in the turn-on condition, to an output destination, the output current loops being balanced and opposed.

11. The high power multi-chip module package of claim 10, wherein the LSS plane and the PSV plane are co-planar.

12. The high power multi-chip module package of claim 10, wherein the LSS plane, the PSV plane, and the HSS plane are all conductive.

13. The high power multi-chip module package of claim 10, wherein the LSS plane, the PSV plane, and the HSS plane are all thin metal layers.

14. The high power multi-chip module package of claim 10, wherein the transistor die driver currents generate a U-shaped transistor die driver current B-Field that is restricted to the open gap.

15. The high power multi-chip module package of claim 10, further comprising an insulator placed between the PSV plane and the HSS plane.

16. The high power multi-chip module package of claim 15, wherein the insulator includes a glass overlay.

17. The high power multi-chip module package of claim 10, wherein the HSS plane includes a cut-out and the cut-out is placed over the portion of the PSV plane.

18. The high power multi-chip module package of claim 10, wherein, at the turn-on condition, a shunt capacitor current loop is created by a current flowing from the shunt capacitor to the first switch or the second switch, the shunt capacitor current loop surrounding the entire open gap, and the shunt capacitor current loop generating a shunt capacitor B-field restricted to the open gap.

\* \* \* \* \*